United States Patent
Findeklee

(10) Patent No.: US 9,229,076 B2
(45) Date of Patent: Jan. 5, 2016

(54) DECOUPLING OF MULTIPLE CHANNELS OF AN MRI RF COIL ARRAY

(75) Inventor: Christian Findeklee, Norderstedt (DE)

(73) Assignee: Koninklijke Philips N.V., Eindhoven (NL)

( * ) Notice: Subject to any disclaimer, the term of this patent is extended or adjusted under 35 U.S.C. 154(b) by 607 days.

(21) Appl. No.: 13/697,797

(22) PCT Filed: Apr. 26, 2011

(86) PCT No.: PCT/IB2011/051801
§ 371 (c)(1), (2), (4) Date: Nov. 14, 2012

(87) PCT Pub. No.: WO2011/148278
PCT Pub. Date: Dec. 1, 2011

(65) Prior Publication Data
US 2013/0063147 A1  Mar. 14, 2013

Related U.S. Application Data

(60) Provisional application No. 61/349,005, filed on May 27, 2010.

(51) Int. Cl.
*G01R 33/36* (2006.01)
*G01R 33/3415* (2006.01)

(52) U.S. Cl.
CPC .......... *G01R 33/3642* (2013.01); *G01R 33/365* (2013.01); *G01R 33/3415* (2013.01)

(58) Field of Classification Search
CPC .................................................. G01R 33/3642
USPC ......................................................... 324/309
See application file for complete search history.

(56) References Cited

U.S. PATENT DOCUMENTS

| 4,825,162 A * | 4/1989 | Roemer ............. G01R 33/3415 324/312 |
| 6,727,703 B2 | 4/2004 | Lee |

(Continued)

FOREIGN PATENT DOCUMENTS

| EP | 1852710 A2 | 11/2007 |
| JP | 2002306442 A | 10/2002 |

(Continued)

OTHER PUBLICATIONS

Ibrahim, et al. "Application of Finite Difference Time Domain Method for the Design of Birdcage RF Head Coils Using Multi-Port Excitations", Magnetic Resonance Imaging 18 (2000) pp. 733-742.

(Continued)

*Primary Examiner* — Rodney Fuller

(57) ABSTRACT

A radio-frequency coil assembly ($18$), for use in a magnetic resonance imaging system ($10$), includes a plurality of coil elements ($18_n$). The coil elements ($18_n$) are connected to a decoupling network ($40$) which includes a plurality of decoupling elements ($40_{n,x}$) connected (via transmission lines) to pairs of coil elements ($18_n$, $18_x$) at corresponding ports ($64_n$, $64_x$) from which the coil can be fed. The decoupling elements ($40_{n,x}$) compensate for mutual coupling between pairs of corresponding coil elements. An inductive coupling loop ($51_n$), with a constant or adjustable mutual inductance, inductively couples the associated coil element ($18_n$) to the corresponding decoupling network port ($64_n$). Transmission lines ($52_n$) electrically connect each inductive coupling loop ($51_n$) to the decoupling network ($40$) at the corresponding port ($64_n$). Each transmission line ($52_n$) has an electrical length of $k\lambda/2$ where $k=0, 1, 2, 3\ldots$ and $\lambda$ is a wavelength of the excited and/or received resonance signals inside the transmission line.

20 Claims, 6 Drawing Sheets

(56) References Cited

U.S. PATENT DOCUMENTS

| | | | |
|---|---|---|---|
| 7,088,104 B2* | 8/2006 | Bottomley | G01R 33/3415 324/322 |
| 7,345,481 B2 | 3/2008 | Leussler | |
| 7,382,132 B1 | 6/2008 | Mathew et al. | |
| 7,616,000 B2* | 11/2009 | Chu | G01R 33/3614 324/318 |
| 7,932,721 B2* | 4/2011 | Nascimento | G01R 33/365 324/309 |
| 2002/0169374 A1 | 11/2002 | Jevtic | |
| 2003/0210049 A1 | 11/2003 | Boskamp et al. | |
| 2003/0214299 A1* | 11/2003 | Lee | G01R 33/3415 324/318 |
| 2003/0214301 A1* | 11/2003 | Lee | G01R 33/365 324/322 |
| 2004/0155656 A1 | 8/2004 | Leussler | |
| 2007/0085540 A1 | 4/2007 | Du et al. | |
| 2008/0129292 A1* | 6/2008 | Leussler | G01R 33/34046 324/318 |
| 2009/0081359 A1 | 3/2009 | Stephenson et al. | |
| 2009/0128154 A1 | 5/2009 | Chu et al. | |

FOREIGN PATENT DOCUMENTS

| | | |
|---|---|---|
| WO | 2007117604 A2 | 10/2007 |
| WO | 2007124247 A1 | 11/2007 |
| WO | 2009062145 A1 | 5/2009 |
| WO | 2010018535 A1 | 2/2010 |

OTHER PUBLICATIONS

Seifert, et al., "Adaptive Coil Control: SNR Optimization of a TR Volume Coil for Single Voxel MRS at 3 T", Proc. Intl. Soc. Mag. Reson. Med. 10 (2002).

Adriany, et al., "Transmit and Receive Transmission Line Arrays for 7 Tesla Parallel Imaging", Magnetic Resonance in Medicine 53:434-445 (2005).

Saekho, et al., "Small Tip angle Three-Dimensioanl Tailored Radiofrequency Slab-Select Pulse for Reduce B1 Inhomogeneity at 3 T", Magnetic Resonance in Medicine 53: 479-484 (2005).

Katscher, et al., "Transmit Sense", Magnetic Resonance in Medicine 49: 1449-150 (2003).

Pruessman, et al., "Sense: Sensitivity Encoding for Fast MRI", Magnetic Resonance in Medicine 42: 952-962 (1999).

Sodickson, et al., "Simultaneous Acquisition of Spatial Harmonics (SMASH): Fast Imaging with Radiofrequency Coil Arrays", MRM 38:591-603 (1997).

Roemer, et al, "The NMR Phased Array", Magnetic Resonance in Medicine 16, 192-225 (1990).

Alagappan, et al., "An 8 Channel Transmit Coil for Transmit Sense at 3T", Proc. Intl. Soc. Mag. Reson. Med. 14 (2006) p. 121.

Leussler, et al., "The Bandpass Birdcage Resonator Modified as a Coil Array for Simultaneous MR Acquisition", 1997 p. 176.

Nistler, et al., "A Degenerate Bandpass Birdcage As Antenna for a 3T Wholebody Transmit Array", Proc. Intl. Soc. Mag. Reson. Med. 14 (2006) p. 2566.

Lee, et al., "Coupling and Decoupling Theory and Its Application to the MRI Phased Array", Magnetic REsonance in Medicine 48:203-213 (2002).

Jevtic, "Ladder Networks for Capacitive Decoupling in Phased-Array Coils", Proc. Intl. Soc. Mag. Reson. Med. 9 (2001) p. 17.

Vernickel, et al., "An Eight Channel Transmit/Receive Body Coil for 3T", Proc. Intl. Soc. Mag. Reson. Med. 14 (2006) p. 123.

Findeklee, et al., "Decoupling of a Multi Channel Transmit/Receive Coil Array via Impedance Inversion", Proc. Intl. Soc. Mag. Reson. Med. 15 (2007) p. 1020.

Decorps, M., et al. An Inductively Coupled, Series-Tuned NMR Probe; 1985; Journal of Magnetic Resonance; 65(1) 100-109.

* cited by examiner

DECOUPLING OF MULTIPLE CHANNELS OF AN MRI RF COIL ARRAY

CROSS-REFERENCE TO RELATED APPLICATIONS

This application is a national filing of PCT application Serial No. PCT/IB2011/051801, filed Apr. 26, 2011, published as WO2011/148278A1 on Dec. 1, 2011, which claims the benefit of U.S. provisional application Ser. No. 61/349,005 filed May 27, 2010, which is incorporated herein by reference.

The present application relates to the magnetic resonance arts. It finds particular application in multi-channel radio-frequency coil assemblies, and will be described with particular reference thereto.

Magnetic resonance imaging (MRI) and spectroscopy (MRS) systems are often used for the examination and treatment of patients. By such a system, the nuclear spins of the body tissue to be examined are aligned by a static main magnetic field $B_0$ and are excited by transverse magnetic fields $B_1$ oscillating in the radiofrequency band. In imaging, relaxation signals are exposed to gradient magnetic fields to localize the nuclear spins. The relaxation signals are received in order to form in a known manner a single or multi-dimensional image. In spectroscopy, information about the composition of the tissue is carried in the frequency component of the resonance signals.

Two types of MR systems that are in common use include "open" MR systems (vertical systems) and "bore-type" systems. In the former, the patient is introduced into an examination zone which is situated between two magnetic poles connected by a C-shaped unit. The patient is accessible during the examination or treatment from practically all sides. The latter comprises a cylindrical examination space (axial system) into which a patient is introduced.

An RF coil system provides the transmission of RF signals and the reception of resonance signals. In addition to the RF coil system which is typically permanently built into the imaging apparatus, special purpose coils can be arranged around or in a specific region to be examined. Special purpose local coils are designed to optimize signal-to-noise ratio (SNR), particularly in situations where homogeneous excitation and high sensitivity detection is required. Furthermore, special sequences of RF signals, higher field strengths, high flip angles or real-time sequences can be realized and generated by multi-channel antenna arrangements, and multi-dimensional excitations can be accelerated.

In some multi-channel transmit/receive RF coil systems, one transmitting unit and one receiving unit are assigned to each RF coil or coil segment. The transmitting units independently adjust the phase, amplitude, and/or shape of a waveform to be transmitted via each RF coil element to achieve the desired excitation, e.g. to compensate for dielectric loading exhibited by the subject while still maintaining pattern homogeneity, reducing scan time, and improving overall power efficiency.

As there is a trend to increase the number of transmit and receive channels in multi-channel coil systems, the coil segments or elements become closer in proximity to one another which in turn exacerbates mutual coupling between individual coil elements. One method to compensate for the mutual coupling is to use a passive decoupling network inside the coil. A passive decoupling network typically allows for decoupling the nearest neighbors. Decoupling progressively more distant coil elements becomes progressively more complex, in many instances becoming impractical. In addition, the passive decoupling network is determined and set for an expected standard patient load, i.e. for an average sized patient. At high field strengths, small changes in the load can have a significant effect on the mutual coupling. The known passive decoupling networks are also very difficult to adjust because a single decoupling element has an impact on multiple coupling paths. Therefore, decoupling individual coil elements using these passive decoupling networks becomes an iterative and time consuming process.

The present application provides a new and improved method and apparatus for inductive feeding with impedance matching and remote decoupling of coil elements which overcomes the above-referenced problems and others.

In accordance with one aspect, a radio-frequency coil assembly is presented. The coil assembly includes a plurality of coil elements which together transmit radio-frequency signals into an examination region to induce or excite magnetic resonance and/or receives induced magnetic resonance signals therefrom. Each pair of coil elements, which exhibits a significant mutual coupling, is associated with a decoupling element. Each decoupling element compensates for a mutual coupling between the corresponding coil element and another coil element of the coil assembly. An inductive coupling loop inductively couples a corresponding coil element to the corresponding decoupling network port. And, transmission lines electrically connect each inductive coupling loop to the corresponding port of the decoupling network. The transmission lines have a length of $k\lambda/2$ where $k=0, 1, 2, 3\ldots$ and $\lambda$ is the wavelength of the induced and/or received resonance signals inside the transmission line.

In accordance with another aspect, a magnetic resonance imaging system is presented. The system includes a main magnet which generates a static magnetic field in an examination region. The system includes the radio-frequency coil assembly which induces (excites) magnetic resonance in selected dipoles of a subject in the examination region and receives a magnetic resonance signal therefrom. And, the system includes a radio-frequency transmitter which causes the radio-frequency coil assembly to generate magnetic resonance excitation and manipulation pulses and a radio-frequency receiver which receives the generated magnetic resonance signals from the radio-frequency coil assembly.

In accordance with another aspect, a method for generating radio-frequency fields is presented. The method includes transmitting radio-frequency signals into an examination region with a plurality of coil elements to excite magnetic resonance and/or receive induced magnetic resonance signals therefrom. A corresponding coil element is inductively coupled to a corresponding decoupling network port with a constant or adjustable inductive coupling loop. A mutual coupling between the corresponding coil element and another coil element is compensated for with a decoupling element connected with the corresponding decoupling network ports of the pair of coil elements. The decoupling element is electrically connected to the inductive coupling loop by a transmission line which has an electrical distance of $k\lambda/2$ where $k=0, 1, 2, 3\ldots$ and $\lambda$ is the wavelength of the induced and/or received resonance signals inside the transmission line.

One advantage is that each pair of individual coil elements can be independently decoupled simply.

Another advantage resides in that decoupling adjustment time is reduced.

Another advantage resides in that manufacturing time and costs are reduced.

Another advantage is that each mutual coupling is compensated by a single decoupling reactance.

Another advantage is that decoupling can be adjusted for each patient.

Another advantage is that the number of transmit and receive channels can be increased.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
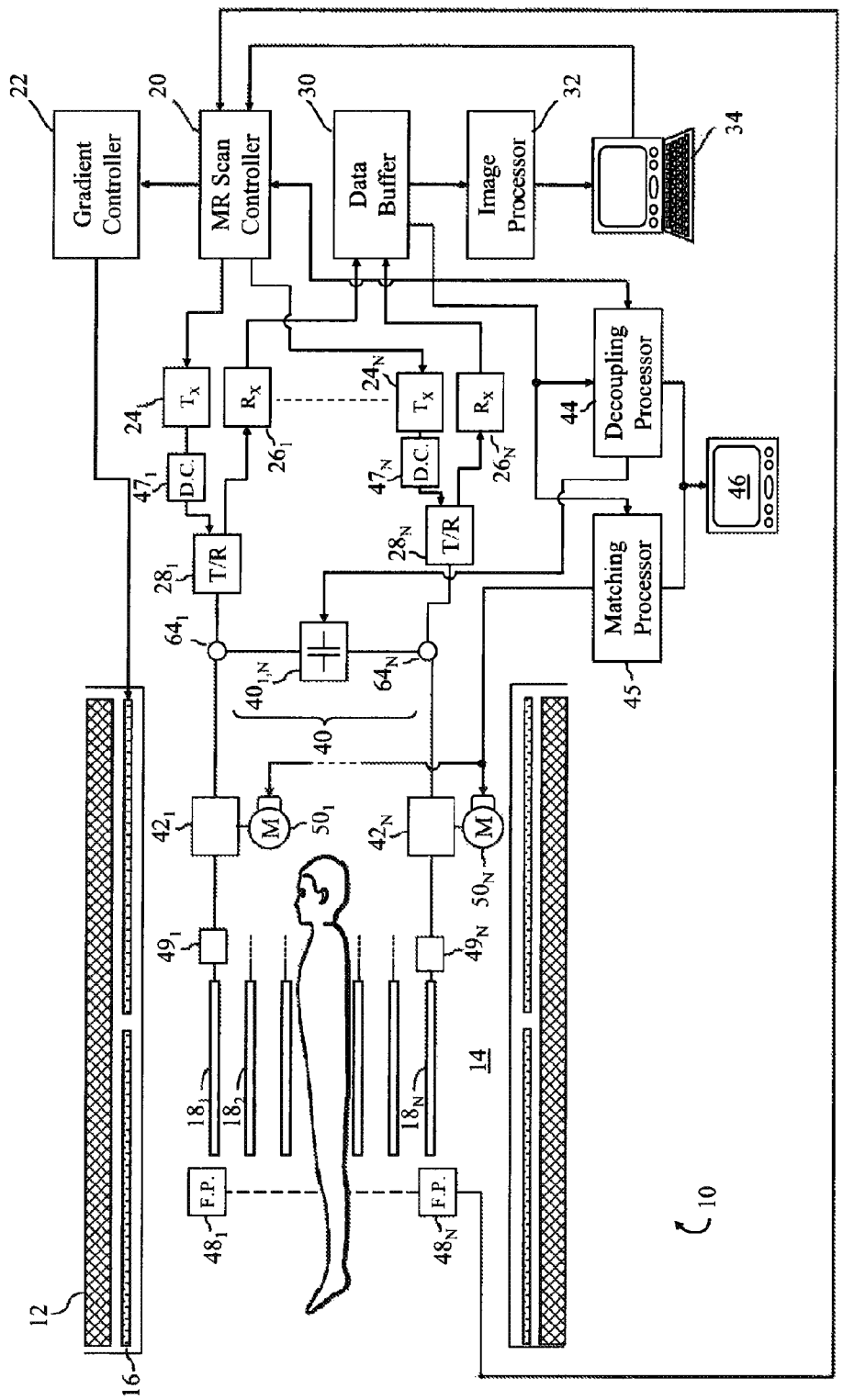
FIG. 1 is diagrammatic illustration of magnetic resonance system including a decoupling network.

With reference to FIG. 1, a magnetic resonance (MR) imaging system 10 includes a main magnet 12 which generates a spatial and temporally uniform $B_0$ field through an examination region 14. The main magnet can be an annular or bore-type magnet, a C-shaped open magnet, other designs of open magnets, or the like. Gradient magnetic field coils 16 disposed adjacent the main magnet serve to generate magnetic field gradients along selected axes relative to the $B_0$ magnetic field for spatially encoding magnetic resonance signals, for producing magnetization-spoiling field gradients, or the like. The magnetic field gradient coil 16 may include coil segments configured to produce magnetic field gradients in three orthogonal directions, typically longitudinal or z, transverse or x, and vertical or y directions.

A radio-frequency (RF) coil assembly 18, such as a whole-body radio frequency coil, is disposed adjacent the examination region. The RF coil assembly includes a plurality of coil elements $18_1, 18_2, \ldots, 18_N$ which collectively generate radio frequency fields for exciting magnetic resonance in dipoles of the subject (an arbitrary one of the coil elements is herein after referred to as $18_n$ and all of the elements collectively as 18. A similar convention is used for other elements described below). The radio frequency coil assembly 18 also serves to detect magnetic resonance signals emanating from the imaging region. It should also be appreciated that the coil assembly may serve to transmit and/or receive radiofrequency signals.

To acquire magnetic resonance data of a subject, the subject is placed inside the examination region 14, preferably at or near the isocenter of the main magnetic field. A scan controller 20 controls a gradient controller 22 which causes the gradient coils to apply the selected magnetic field gradient pulses across the imaging region, as may be appropriate to a selected magnetic resonance imaging or spectroscopy sequence. The scan controller 20 also controls an array of RF transmitters 24 including individual transmitters $24_1, 24_2, \ldots, 24_N$, each of which causes one or more of the RF coil elements $18_n$ to generate magnetic resonance excitation and manipulation $B_1$ pulses. The scan controller also controls an array of RF receivers 26 including individual receivers $26_1, 26_2, \ldots, 26_N$, each of which is connected to one or more of the RF coil elements 18 to receive the generated magnetic resonance signals therefrom. Rather than independent transmitters as illustrated, one or more multi-channel transmitters can have a channel connected to a corresponding transmit element, which collectively generates the resonance excitation and manipulation $B_1$ pulses in the transmit coils. Likewise, one or more RF receivers can also include multiple channels, each connected to a corresponding receive coil, which receives the generated magnetic resonance signals. In one embodiment, each coil elements acts as a transmit and a receive coil element. In this embodiment, the scan controller controls an array of transmit/receive switches 28 including individual switches $28_1, 28_2, \ldots, 28_N$ which electrically couples the coil elements to the corresponding transmit or receive channel.

The received data from the receivers 26 is temporarily stored in a data buffer 30 and processed by a magnetic resonance image, spectroscopy, or other data processor 32. The magnetic resonance data processor can perform various functions as are known in the art, including image reconstruction (MRI), magnetic resonance spectroscopy (MRS), catheter or interventional instrument localization, and the like. Reconstructed magnetic resonance images, spectroscopy readouts, interventional instrument location information, and other processed MR data are stored in memory, such as a medical facility's patient archive. A graphic user interface or display device 34 includes a user input device which a clinician can use for controlling the scan controller 20 to select scanning sequences and protocols, display MR data, and the like.

Each element $18_n$ of the RF coil assembly is inductively fed and matched by a single feeding element $42_n$ and remotely decoupled from other coil elements by a decoupling network 40 which includes a plurality of decoupling elements $40_{n,x}$. It should be appreciated that other ways of feeding and matching the elements are also contemplated. Each decoupling element $40_{n,x}$ compensates for mutual coupling between a corresponding pair coil elements $18_n$ and $18_x$, where n and x represent the indices of the coil elements which correspond to the pair. Mutual coupling can arise from the close proximity of coil elements to one another or RF transmitter to one another and may depend on patient loading, especially at higher field strengths. A matching adjustment system allows adjustment of the individual matching elements in $42_n$ such that the impedance of each coil element matches that of the RF transmitter, typically 50 Ω.

After the impedances are matched such that coil reflections are minimized, a decoupling processor or computer routine 44 controls the scan controller 20 which in turn controls a pair of RF transmitters $24_{n,x}$ to transmit decoupling test signals and to receive outputs from the corresponding pair of receivers $26_{n,x}$ in response to each test signal. Note, due to reciprocity, the coupling from $64_n$ to $64_x$ is the same as the coupling from $64_x$ to $64_n$. In one embodiment, the decoupling processor 44 determines the degree of coupling between the pair coil elements $18_n$ and $18_x$ and displays it on a display 46. The reflection and/or decoupling is measured, e.g. via directional couplers $47_n$. Alternatively, magnetic field probes $48_n$, each probe disposed near a coil element $18_n$, can measure pick-up signals or sensors $49_n$, e.g. voltage and/or current sensors, disposed at each coil input can measure signals on the coil from which the compensatory decoupling element and/or the adjustment of the matching circuits can be derived. A technician manually adjusts/tunes the decoupling networks $40_{n,x}$ until the coupling is minimized or within an acceptable range. In another embodiment, the decoupling processor 44 controls the decoupling networks $40_{n,x}$ and networks $42_n$ of the coil elements $18_n$.

Elements whose mutual couplings are not being measured can be disabled (opened by transformed (via the mutual coupling) short circuit of conducting diodes 74n). It should be appreciated that other detuning methods are also contemplated, such as active, passive, or the like detuning methods. Matching and decoupling of the coil elements $18_n$ can be adjusted one by one with (e.g. piezoelectric) motors 50 including motors $50_1, 50_2, \ldots, 50_N$, to optimize the impedance matching and decoupling networks corresponding to the pairs of coil elements who exhibit coupling.

Figure 2A:
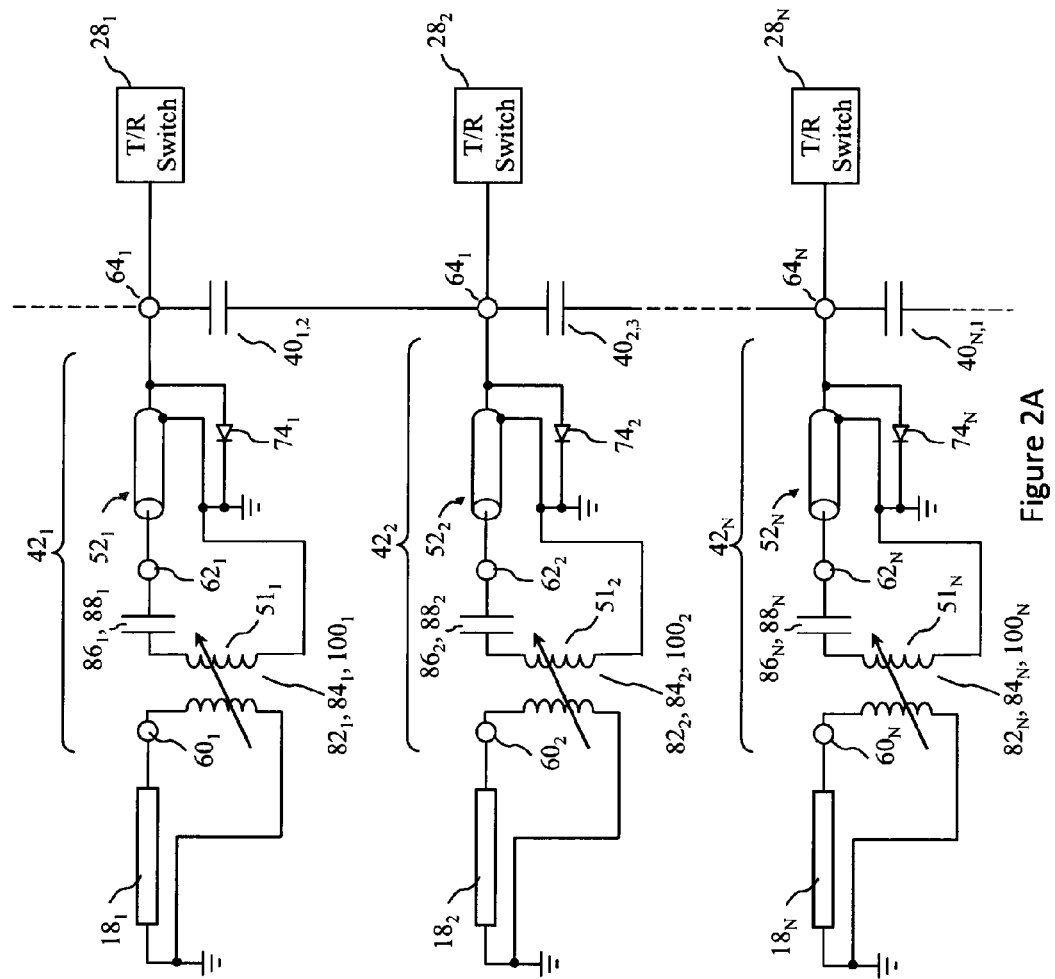
FIG. 2A is a diagrammatic illustration of the decoupling network.

With reference to FIG. 2A, any pair of coil elements $18_n$ and $18_x$ is decoupled to one another by a corresponding decoupling element $40_{n,x}$. Each element $42_n$ includes a preferable adjustable inductive element $51_n$, such as an inductive coupling loop, an adjustable transformer, or the like, and a transmission line $52_n$. Each transmission line $52_n$ has an electrical length measuring a multiple of one half wavelength or $k\lambda/2$ where $k=0, 1, 2, 3 \ldots$ and $\lambda$ is the wavelength of the induced and/or received resonance signals inside the transmission lines. For example, in a 3 Tesla (T) scanner the protons have a Larmor frequency of approximately 128 MHz which corresponds to a wavelength of 235 cm in free space. Inside a coaxial cable with a (relative) dielectric constant of about $\in_r=2$, a half-wavelength transmission line would measure 83 cm. It should be noted that k, the type of transmission line (e.g. coaxial cable, twisted pair cable, micro-strip, coplanar waveguide, strip-line, waveguide, equivalent lumped element circuit, or any combination thereof), and the characteristic impedance of the transmission lines may differ amongst coil elements depending on the position of the corresponding coil element $18_n$.

Alternatively, since the transmission lines just need to behave electrically as a transmission line, they may also be realized, at least partly, by lumped-element transmission lines which use lumped circuits of capacitors, inductors, or the like to achieve an equivalent half-wavelength transmission line in a space fraction of what a physical transmission line occupies. Even though the illustrated embodiment depicts the inductive element $51_n$ between the transmission line $52_n$ and the coil element $18_n$, it should be appreciated that the transmission line $52_n$ can be disposed between the inductive element $51_n$ and the coil element $18_n$. The order of the inductive element $51_n$ and the transmission line $52_n$ is arbitrary.

Figure 2B:
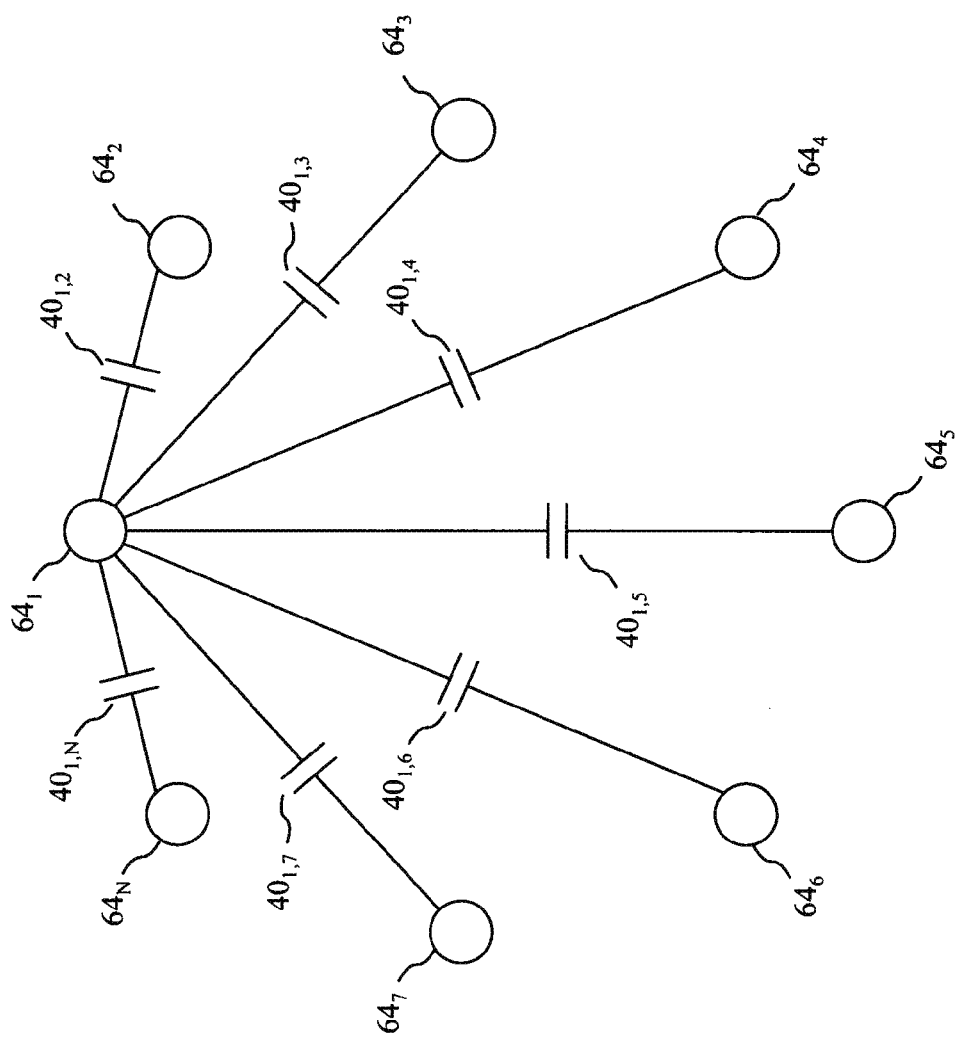
FIGS. 2B and 2C are diagrammatic illustrations of the decoupling network ports and decoupling elements connected to the corresponding decoupling network ports.
Figure 2C:
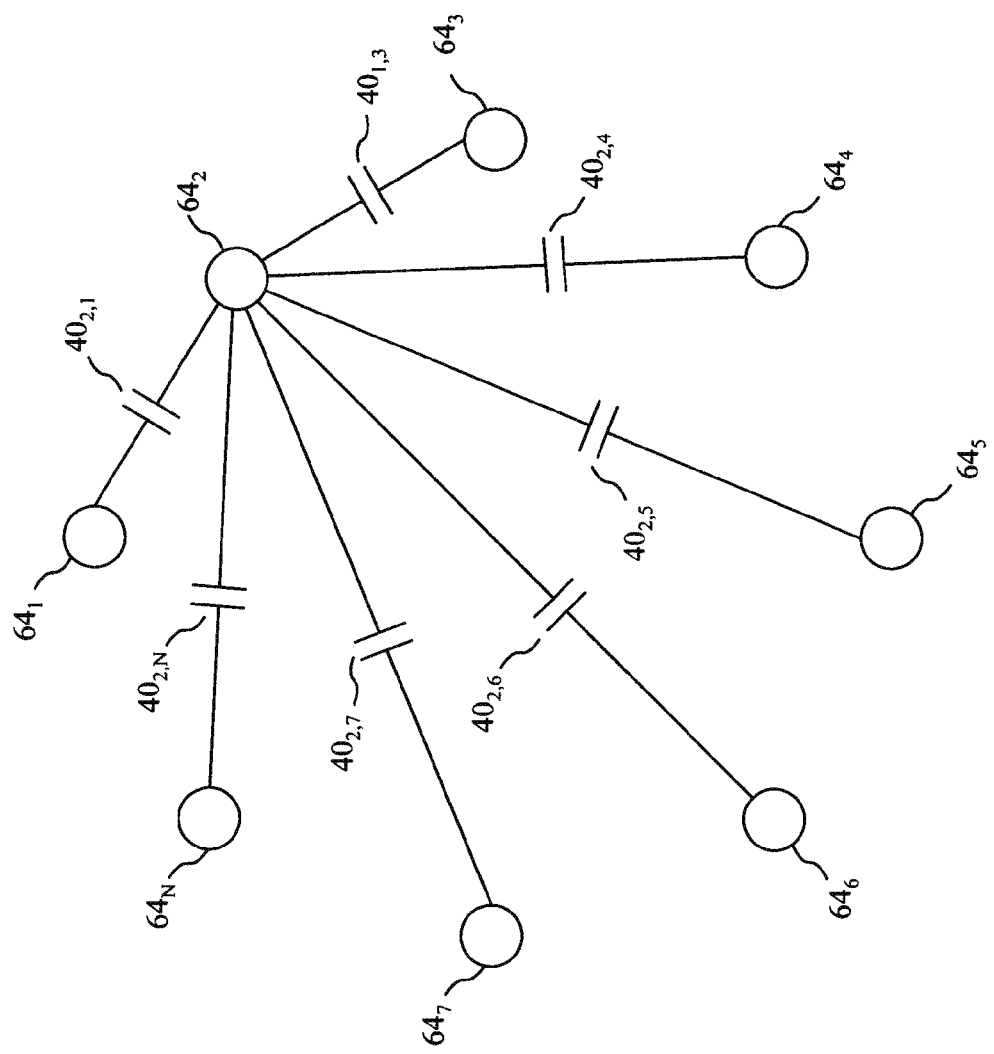

Each decoupling element $40_{n,x}$ acts to compensate for mutual coupling between any pair of coil elements $18_n, 18_x$. For example, the decoupling element $40_{1,2}$ compensates for any mutual coupling between coil elements $18_1$ and $18_2$ that may exist. Following the same convention, the decoupling element $40_{1,N}$ can be tuned to compensate for any mutual coupling between $18_1$ and $18_N$. Furthermore, additional decoupling elements $40_{1,x}$ are provided to compensate any mutual coupling between $18_1$ and any non-adjacent coil elements $18_x$, as shown in FIGS. 2B and 2C which diagrammatically illustrates annularly arranged coil elements 18, for a possible total of $\Sigma_{i=1}^{N-1} i = N(N-1)/2$ decoupling elements $40_{n,x}$ which makes up the decoupling array 40. Each decoupling element $40_{n,x}$ is individually tuned if a mutual coupling exists between corresponding coil elements $18_n$ and $18_x$. To determine which pairs of coil elements 18 exhibit mutual coupling, the decoupling processor 44 selectively disables all other coil elements $18_m$, where $n \neq m \neq x$, whose mutual couplings are not being measured, i.e. coil elements $18_n$ and $18_x$ are not disabled. If a mutual coupling exists, then the reactance of the corresponding decoupling element is tuned to compensate for the mutual coupling. If no mutual coupling exists, then the reactance is tuned to represent an open circuit or it can be simply left out. Note that the decoupling element $40_{n,x}$ is equivalent to $40_{x,n}$ due to reciprocity.

Each element $42_n$ includes an inductive coupling $51_n$ which also acts as block for common mode currents by eliminating a galvanic connection between a coil element $18_n$ and the transmission line $52_n$ and thus galvanically isolates the coil element $18_n$ from the transmission line $52_n$. Common mode currents may be induced onto any electrical conductor within the examination region 14, especially within the magnetic field generated by the coil elements $18_n$. Electrical elements such as the elements $42_n$, the coil segments $18_n$, or the like, but most likely induced resonances of the feeding system of the RF coil assembly 18, carry common mode currents. Each adjustable inductive element $51_n$ can be adjusted to match the impedance of the corresponding coil element $18_n$ to a characteristic impedance $Z_0$ of a corresponding feeding system, which includes the corresponding T/R switch $28_n$ and transmitter $24_n$ or receiver $26_n$ at a decoupling network port $64_n$. In one embodiment, a tuning/matching processor 45 controls actuators $50_n$, e.g. piezoelectric motors, to adjust the adjustable inductive elements $51_n$ to optimize the impedance matching of the coil elements. Alternatively the tuning/matching processor 45 determines the degree of coil reflection and displays it on a display 46. In another embodiment, the adjustable inductive elements $51_n$ are tunable transformers with an adjustable insert disposed between the coil windings. By adjusting the position of the insert, the magnetic flux between the coil windings is adjusted to match the impedance of the feeding system. It should be noted that only coil elements $18_n$ that exhibit a reflection due to an impedance mismatch are adjusted accordingly.

To ensure independence between the decoupling elements, each decoupling element $40_{n,x}$ is spaced a multiple of one half wavelength or $k\lambda/2$ from the corresponding adjustable inductive element $51_n$ by the transmission line $54_n$ therebetween. In this arrangement, the decoupling elements $40_{n,x}$ can be spaced externally from the corresponding coil elements $18_n$, $18_x$ which allows for each mutual coupling between each pair of coil elements $18_n$ and $18_x$ to be compensated by a single reactive element, such as a capacitor (as illustrated), an inductor, or the like. This arrangement reduces design complexity, especially due to the independence of decoupling elements $40nx$, and thus reduces manufacturing costs and time. In previous decoupling networks, the decoupling elements were positioned inside the coil assembly which resulted in multiple mutual coupling paths in addition to the mutual coupling between the adjacent coil elements. These previous designs increased the manufacturing costs and time. The resulting interdependence of decoupling elements also made the adjustment procedure for each decoupling element an iterative and time-consuming task. (See also C. Findeklee et al., "Decoupling of a Multi Channel Transmit/Receive Coil Array via Impedance Inversion" in Proceedings of the 15th Annual Meeting of ISMRM, 2007 p. 1020 which explains another method with independence of decoupling elements).

Each transmission line $52_n$ includes two conductors, an inner conductor $70_n$ and an outer conductor $72_n$, as in a coaxial cable. Each inner conductor can be selectively grounded by a detuning switch $74_n$, at least at one end of the transmission line, such as a PIN diode, MEM switch, or the like, to detune (switch off) the corresponding coil element $18_n$ such as during the use of other coils in the examination region or during adjustment procedure where mutual coupling is determined and a compensation reactance can be determined therefrom. Alternatively, other switching methods are also contemplated. For example, to determine the mutual coupling imposed on coil element $18_2$ by coil element $18_1$, the other coil elements $18_3\text{-}18_N$ are detuned. A response to a decoupling test signal which is characteristic of the mutual coupling is measured and the decoupling element $40_{1,2}$ is tuned accordingly or one with an appropriate reactance is chosen. Likewise, to determine the mutual coupling imposed by coil element $18_3$ on coil element $18_2$, the other coil elements $18_1$ and $18_4$-$18_N$ are detuned. The detuning switches $74_n$ are electronically controlled by the decoupling processor 44 during the adjustment procedure.

Figure 3:
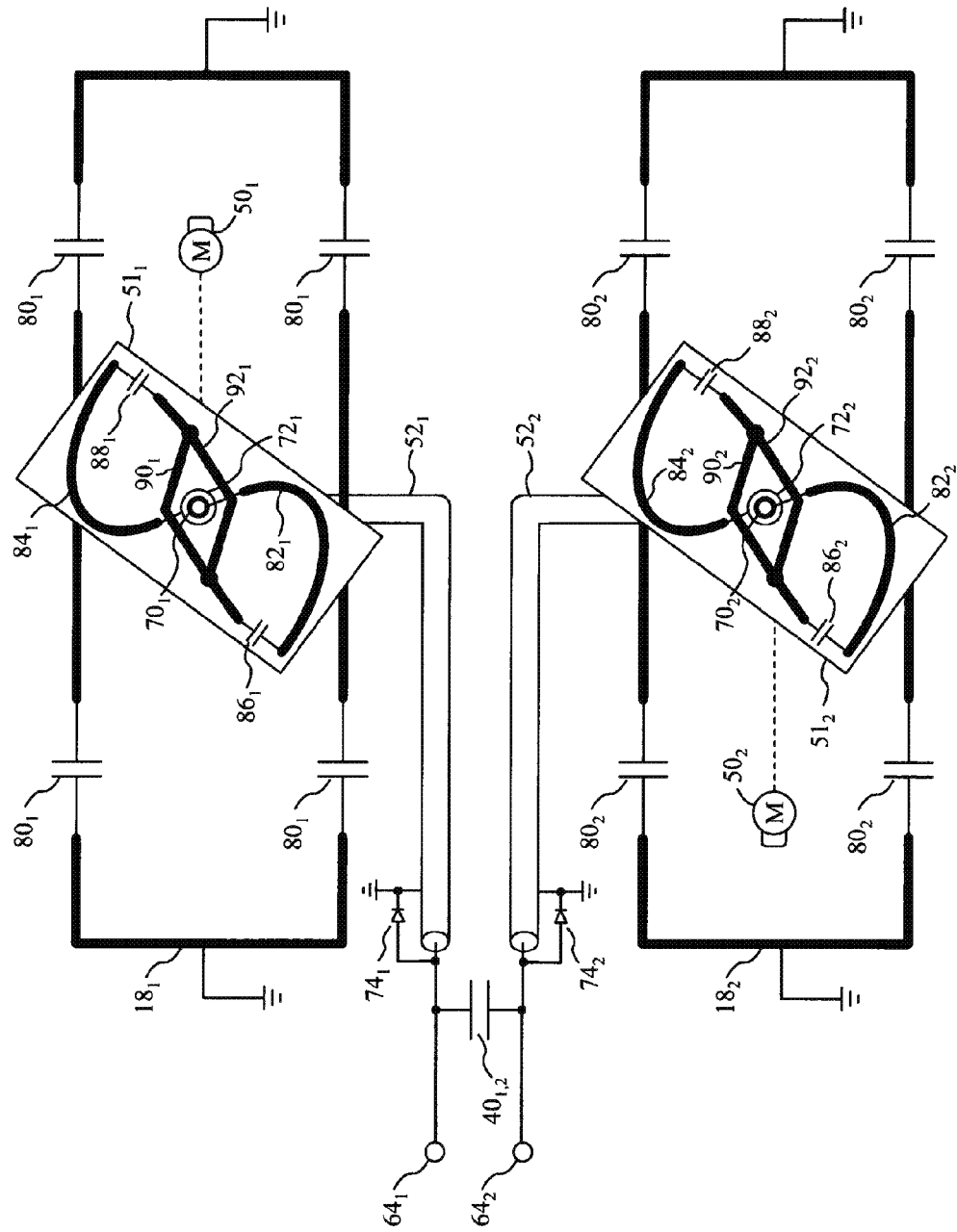
FIG. 3 is a diagrammatic illustration of one embodiment of a radio-frequency coil assembly.

With reference to FIG. 3, in one embodiment, each coil element $18_n$ is a TEM-type coil element with resonance elements $80_n$. The corresponding adjustable inductive element $51_n$ is a concentrically positioned reactive figure-eight loop circuit. Each figure-eight loop circuit is disposed on, e.g. a printed circuit board, and includes two conductor loops $82_n$, $84_n$, and associated reactive element $86_n$, $88_n$, such as capacitors, which are arranged to form a figure-eight loop around a galvanic connection to the corresponding transmission line $52_n$. It should be appreciated that each conductor loop $82_n$, $84_n$ may include more than one reactive element or a single reactive element at only one conductor loop is also contemplated. At the galvanic connection, the first conductive loop $82_n$, and the associated reactive element $86_n$, are connected to the inner conductor $70_n$ of the transmission line $52_n$, while the second conductive loop $84_n$, and the associated reactive element $88_n$, are connected to the outer conductor $72_n$ of the transmission line $54_n$. The loops $82_n$ and $84_n$ are symmetric with each other and series connected $90_n$, $92_n$ where the conductors of the figure eight cross the feeding point without being interconnected. The circuit board is rotatable around the transmission line $52_n$. The rotation of the printed circuit board relative to the coil element $18_n$ adjusts the matching of the coil element. The circuit board is rotated to match the characteristic impedance of the coil elements to the characteristic impedance of the feeding system at port $64_n$. As noted above, the impedance of each coil element $18_n$ changes with coil loading, e.g. by the patient.

Figure 4:
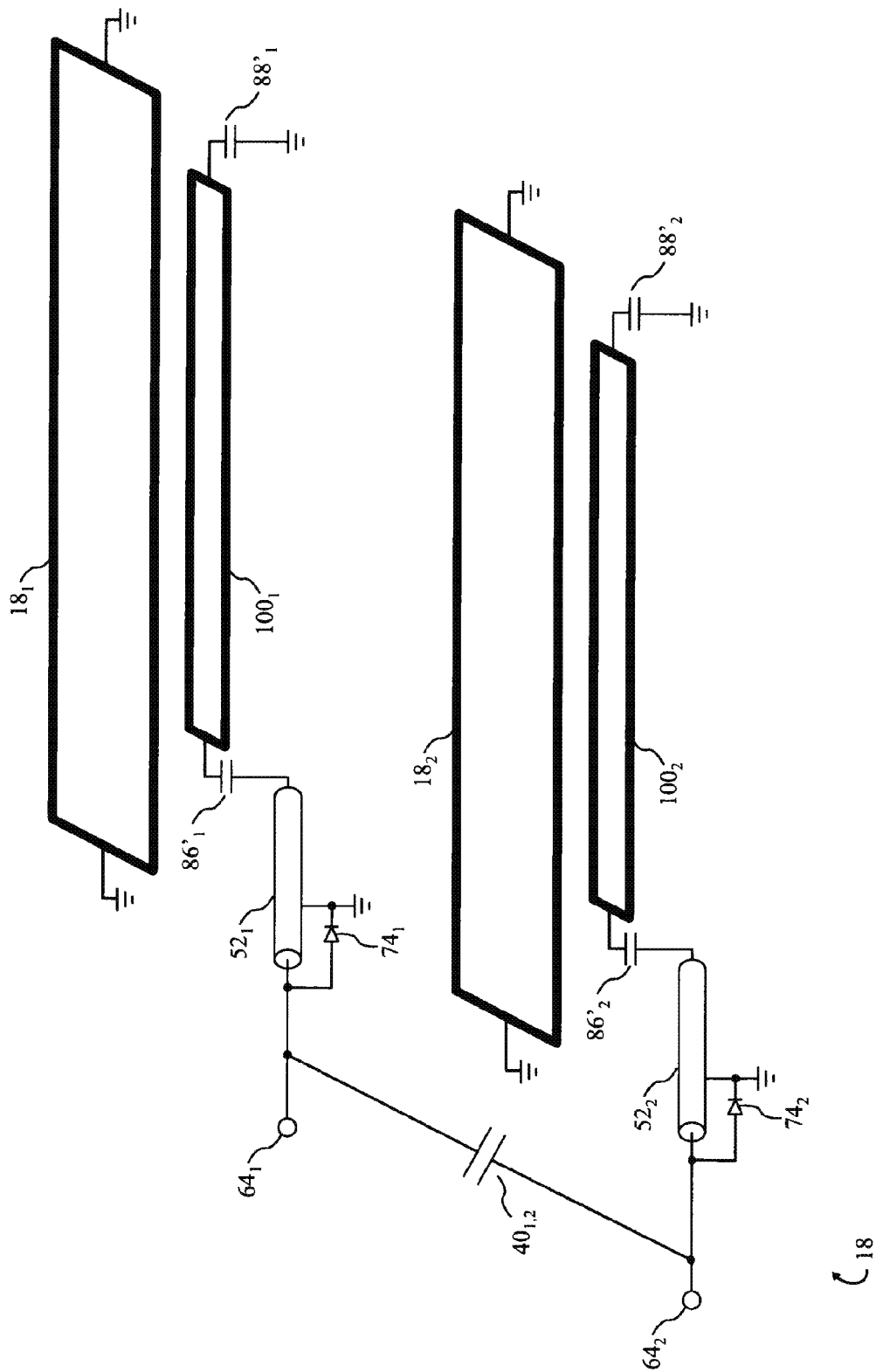
FIG. 4 is a diagrammatic illustration of another embodiment of a radio frequency coil assembly.

With reference to FIG. 4, in another embodiment, each coil element $18_n$ is a resonant TEM-type coil element connected to a ground plane. The corresponding adjustable inductive element $100_n$ is realized by a TEM-type element rather than the figure-eight loop previously described. The inductive element $100_n$ is positioned below a TEM-type coil and includes associated reactive element(s) $86'_n$, $88'_n$. The inductive coupling element $100_n$ is translatable relative to the corresponding TEM element to adjust a spatial relationship between the inductive coupling element $100_n$ and the coil element $18_n$, hence, the inductive coupling. Since the adjustable inductive element $100_n$ is grounded, i.e. to a shared RF screen, the translation is realized by a flexible TEM-type coupling element which can be adjusted by a screw that defines the position relative to the coil element $18_n$. It should be appreciated that other coil geometries for the adjustable coupling element $51_n$, such as a loop coil or the like, and methods for deforming the flexible TEM-type coil are also contemplated.

By adjusting the resonant elements $80_n$, each coil element $18_n$ is tuned to the resonance frequency and then the adjustable coupling elements $51_n$ are adjusted to match the impedance of the feeding system. It should be the noted that the resonance elements $80_n$ and adjustable coupling elements $51_n$, together, provide two degrees of freedom for an impedance match. Once the coil elements $18_n$ are tuned and matched, the decoupling elements $40_n$ are individually adjusted to decouple the coil elements $18_n$. Once a decoupling element $40_{n,x}$ is selected, e.g. by a suitable capacitor, the (adjustment of the) impedance matching might be performed again, if necessary. In one embodiment, the adjustable inductive elements $51_n$ are fixedly adjusted during the initial setup. That is, once the desired adjustment is determined and each adjustable inductive element $51_n$ is accordingly adjusted, as needed, the adjustable coupling elements $51_n$ are then fixed such that no further adjustment is made and a protective housing is then installed. Typically a desired adjustment is determined based on an average-sized patient loading which can be realized with a phantom to simulate an average-sized patient.

In another embodiment, each adjustable coupling element $51_n$, $100_n$ is adjustable by a non-ferrous actuator $50_n$ after the protective housing is installed. The non-ferrous actuator can be a piezo-electric motor that is electronically controlled via the tuning/matching processor 45, or the non-ferrous actuator can be a realized by a series of pull wires, such as nylon, which can be manually pulled or motor controlled remotely from the imagining region. Each actuator $50_n$ acts to adjust the orientation and/or position of the associated adjustable coupling element $51_n$, $100_n$ relative to a corresponding coil element $18_n$. In this manner, the impedance matching between the coil elements $18_n$ at the decoupling network ports $64_n$ can be dynamically adjusted for each patient. For example, a larger patient exhibits a greater loading on individual coil elements $18_n$ versus a smaller patient. Furthermore, regions such as the shoulders and chest region exhibit a greater loading than regions such as the legs, ankles, and feet.

In another embodiment, each decoupling element $40_{n,x}$ of the decoupling network 40 is an adjustable decoupling element, such as a variable capacitor, which is remotely adjusted by the tuning/matching or the decoupling processor 44, 45. Additionally, each resonance element $80_n$, $86_n$, $88_n$ can be realized as an adjustable resonance element, such as a variable capacitor, which is remotely adjusted by the tuning/matching processor 45. As previously noted, a patient can exhibit loading on individual coil elements $18_n$. This changes the impedance matching between the coil $18_n$ and the decoupling network port $64_n$ (52 does not have to have the same impedance) which is adjustably compensated by the adjustable coupling element $51_n$ and/or adjustable resonance element(s). A tunable decoupling 40 and matching enables patient dependent coil adjustment which can improve power efficiency and signal to noise ratio of the imaging system 10.

In another embodiment, the inductive connection via $42_n$ and the remote decoupling 40 of the coil elements is combined with one or more existing decoupling methods, such as inductive decoupling, ladder networks, or impedance inversion. For example, in inductive decoupling methods, coil elements are overlapped to decouple directly adjacent (next neighbor) coil elements, as typically done in receive coil arrays. Mutual coupling between non-adjacent coil elements, e.g. the second closest neighbor coil element(s), cannot be compensated for by this over lapping method. However, the decoupling of non-adjacent coil elements can be achieved by inductive connecting the corresponding coil elements $18_{n,x}$ with elements $42_n$, $42_x$ and remotely decoupling the non-adjacent coil elements with a corresponding decoupling element $40_{n,x}$ which is electrically distanced from the coil by $k\lambda/2$ transmission lines $52_n$, $52_x$, or equivalent lumped element transmission lines. In the Impedance Inversion method, the inductive feedings and matching networks are replaced by quarter-wavelength transmission lines of $(2k+1)\lambda/4$ where k=0, 1, 2, 3 between the coil elements $18_n$ at ports $60_n$ and the remote decoupling network 40 at ports $64_n$. It should be noted that these two methods can share the same decoupling network 40, i.e. a single matching element $42_n$ can be replaced by an equivalent circuit, such as a quarter wavelength transmission line, while the decoupling network 40 is maintained.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A radio-frequency coil assembly, comprising:
a plurality of N coil elements which transmits radio-frequency signals into an examination region to excite magnetic resonance and/or to receive induced magnetic resonance signals therefrom;
a decoupling network of up to $\Sigma_{i=1}^{N-1}$ i=N(N−1)/2 decoupling elements, each decoupling element electrically decoupling a pair of corresponding coil elements;
inductive coupling loops which inductively couple the corresponding coil elements to corresponding decoupling network ports; and
transmission lines which electrically connect each inductive coupling loop to the corresponding decoupling network port located at the decoupling network, the transmission line having an electrical distance of $k\lambda/2$ where k=0, 1, 2, 3 . . . and $\lambda$ is the wavelength of the excited and/or received magnetic resonance signals inside the transmission line.

2. The radio-frequency coil assembly according to claim 1, wherein the value of k, the characteristic impedance, and a type of the transmission lines varies from channel to channel.

3. The radio-frequency coil assembly according to claim 2, wherein the transmission lines include at least one of a coaxial cable, twisted pair cable, micro-strip, coplanar waveguide, strip-line, waveguide, equivalent lumped element circuit, or any combination thereof.

4. The radio-frequency coil assembly according to claim 1, wherein each decoupling element is a reactive element with a reactance based on the mutual coupling between the pair of coil elements.

5. The radio-frequency coil assembly according to claim 1, wherein one or more inductive coupling loops include at least one adjustable circuit which, when adjusted, matches an impedance of the coil element to the decoupling network port which than can be used for feeding the corresponding element.

6. The radio-frequency coil assembly according to claim 1, wherein the inductive coupling loop includes a pair of conductors arranged to form a figure-eight loop, at least one loop including at least one reactive element.

7. The radio-frequency coil assembly according to claim 1, wherein each adjustable inductive element is adjustable by at least one of rotation, deformation, and translation of at least one of the inductors or an insert defining the mutual flux.

8. A magnetic resonance imaging system, comprising:
a magnet which generates a static magnetic field in an examination region;
a radio-frequency coil assembly according to claim 1 which excites magnetic resonance in selected dipoles of a subject in the examination region, and receives a magnetic resonance signal therefrom;
a radio-frequency transmitter which causes the radio-frequency coil assembly to generate magnetic resonance excitation and manipulation pulses; and
a radio-frequency receiver which receives the generated magnetic resonance signals from the radio-frequency coil assembly.

9. The magnetic resonance imaging system according to claim 8, further including:
a decoupling processor or computer routine which controls the radio-frequency transmitter to send test signals to a selected decoupling network port;
at least one of directional couplers, magnetic field probes, and signal sensors which determine impedance mismatch at corresponding feeding ports and/or which measure a degree of mutual coupling between pairs of corresponding coil elements according to the sent test signals.

10. The magnetic resonance imaging system according to claim 9, further including:
a tuning/matching processor or computer routine which controls actuators to adjust one or more of the inductive coupling loops and/or to control adjustable reactances of corresponding reactive elements to adjust the inductive coupling with the corresponding coil element and the impedance at the corresponding decoupling network port.

11. The magnetic resonance imaging system according to claim 8, further including:
a display unit which displays the measured impedance mismatch and/or the measured degree of mutual coupling.

12. The magnetic resonance imaging system according to claim 8, wherein the decoupling network with corresponding inductive coupling loops and a transmission lines are combined with existing decoupling methods, such as inductive decoupling, ladder networks, or impedance inversion.

13. A method for generating radio-frequency fields, comprising:
transmitting radio-frequency signals into an examination region with a plurality of coil elements to induce magnetic resonance and/or receive induced magnetic resonance signals therefrom;
inductively coupling a corresponding coil element to a corresponding decoupling network port with an inductive coupling loop;
compensating for mutual coupling between pairs of coil elements with decoupling elements connected with corresponding ports, the decoupling elements being electrically connected to the adjustable inductive elements by transmission lines which have an electrical length of $k\lambda/2$ where k=0, 1, 2, 3 . . . and $\lambda$ is a wavelength of the excited and/or received resonance signals inside the transmission lines.

14. The method according to claim 13, wherein one or more transmission lines are realized by, at least partly, a lumped-element transmission line with equivalent circuit elements such as capacitors and/or inductors.

15. The method according to claim 13, wherein each adjustable inductive element includes a loop coil or a pair of conductors arranged to form a figure-eight loop, at least one loop including at least one reactive element.

16. The method according to claim 13, wherein each inductive coupling is adjustable by at least one of rotation, translation, and deformation of at least one of the inductors or an insert defining the mutual flux.

17. The method according to claim 13, further including:
generating a static magnetic field in an examination region;
with the radio-frequency coil elements, at least one of:
(1) generating magnetic resonance excitation and manipulation pulses or inducing magnetic resonance in selected dipoles of a subject in the examination region; or
(2) receiving the generated magnetic resonance signals from the imaging region.

18. The method according to claim 17, further including:
controlling radio-frequency transmitters to send test signals to selected decoupling network ports;

measuring the impedance mismatch at the corresponding feeding ports and/or measuring the mutual coupling between pairs of corresponding coil elements;

monitoring signals received by selected other coil elements;

controlling actuators to adjust one or more of the inductive coupling loops and/or controlling adjustable reactances of corresponding reactive elements to adjust the inductive coupling between corresponding coil elements and the impedance at the corresponding feeding ports according to the measured impedance mismatch; and controlling adjustable reactances of the decoupling elements to adjust the mutual couple between corresponding coil elements according to the measured degree of mutual coupling.

19. The method according to claim 18, further including:

displaying the measured impedance mismatch and/or the degree of mutual coupling.

20. The method according to claim 17, wherein the decoupling network with corresponding inductive coupling loops and transmission lines is combined with an existing decoupling method, such as inductive decoupling, ladder networks, or impedance inversion or the like.

* * * * *